United States Patent
Nordman et al.

[11] Patent Number: 6,026,032
[45] Date of Patent: Feb. 15, 2000

[54] HIGH SPEED DATA BUFFER USING A VIRTUAL FIRST-IN-FIRST-OUT REGISTER

[75] Inventors: Joseph M. Nordman, West Bend; Stephen W. Bailey, Slinger, both of Wis.

[73] Assignee: Genroco, Inc., Slinger, Wis.

[21] Appl. No.: 09/143,744

[22] Filed: Aug. 31, 1998

[51] Int. Cl.[7] .................................................. G11C 7/00
[52] U.S. Cl. .............. 365/189.05; 365/221; 365/230.05; 365/230.09
[58] Field of Search .............................. 365/189.05, 221, 365/230.05, 230.09

[56] References Cited

U.S. PATENT DOCUMENTS

| | | | |
|---|---|---|---|
| 5,420,984 | 5/1995 | Good et al. | 395/275 |
| 5,487,049 | 1/1996 | Hang | 365/221 |
| 5,787,454 | 7/1998 | Rohlman | 365/230.05 X |
| 5,825,692 | 10/1998 | Baumgartner et al. | 365/221 |

*Primary Examiner*—Huan Hoang
*Attorney, Agent, or Firm*—Quarles & Brady LLP

[57] ABSTRACT

A dual-port, static random access memory (DPSRAM) is configured as a virtual first-in-first-out (FIFO) register under the control of a microprocessor executing a stored program or similar circuit to allow both for conventional random access data buffering between the data source and the data receiver and FIFO-type data buffering in which the data source and data receiver need not generate an address for each data word transferred, but these addresses may be automatically generated in sequence by the buffer using special circuitry.

10 Claims, 3 Drawing Sheets

HIGH SPEED DATA BUFFER USING A VIRTUAL FIRST-IN-FIRST-OUT REGISTER

CROSS-REFERENCE TO RELATED APPLICATIONS

STATEMENT REGARDING FEDERALLY SPONSORED RESEARCH OR DEVELOPMENT

BACKGROUND OF THE INVENTION

The invention relates generally to electronic memory devices used as data buffer temporarily storing digital data transmitted between two different devices.

Data buffers are known for providing temporary storage of transmitted data to eliminate inefficiencies when the data source or data receiver is idle while waiting for the other. A data buffer, by smoothing the transmission rate of data intermittently transmitted or received, increases the efficiency of data flow. Data buffers are used to accommodate continuous data flow where the data source and data receiver have different data rates.

For high speed data buffering, it is known to use a Dual-Port, Static Random Access Memory (DPSRAM) which operates analogously to standard computer memory, allowing reading or writing in arbitrary order of a number of memory addresses, but with the additional feature that independent reading and writing can occur through separate ports. When a DPSRAM is used as a data buffer, data is written through one port at first address locations, while data is read through a second port from different address locations. Data may be written to and read from the DPSRAM at different rates. On such DPSRAM data buffer is commercially available from the assignee of the present application, GENROCO, Inc., under the tradename of TURBOstor®, and is the subject of U.S. Pat. No. 5,420,984 hereby incorporated by reference.

The dual ports of the DPSRAM eliminates the delay implicit in sharing addressing resources between the input and output, but the random access nature of the DPSRAM introduces some delays because addresses for each word of data must be generated prior to transmitting that word, to identify the location of the data being read from or written to the DPSRAM. Nevertheless, the DPSRAM architecture is extremely flexible and intuitive.

An alternative data buffer design uses a first-in-first-out (FIFO) register in which data is entered into an input of the register and may independently be read out of the output of the register, in the same order in which it was entered. Transferring data into and out of a FIFO register can be extremely rapid because the data is entered and accepted in serial fashion, and thus addressing delays are avoided. Yet, despite the speed advantage of a FIFO register, it is relatively inflexible and may be cumbersome for certain types of data transfer where the data is not sequential. Further, for certain data receiving devices, the amount of data held in the buffer (word count) must be known prior to reading it out. If this information is known only after the buffer is filled, in a FIFO buffer, the word count must be placed in a trailing position, not accessible to the reading device. Finally, monitoring data latency, i.e., how long it takes the data to pass through the buffer, is difficult in a FIFO system.

Ideally, the good features of a FIFO and DPSRAM data buffer could be realized in one device.

BRIEF SUMMARY OF THE INVENTION

The present invention provides the speed advantages of a FIFO-type buffer with the flexibility of a DPSRAM buffer by implementing a "virtual FIFO buffer" (VFIFO) in a DPSRAM-type device. FIFO-type segments are defined within the DPSRAM address space that may rapidly receive or output data as sequenced by special hardware address counters, thus eliminating the delay of normal address cycles needed for RAM-type memory. Each segment may be associated with a control block indicating (1) whether the segment is filled or not, (2) the starting address of the data to be used by the receiving device, (3) a word count of the data and (4) performance tags to track the performance of the buffer system. Because the control blocks, like all the elements of the segments, can be randomly accessed, this data may be read to or read out, of order by the transmitting or receiving device. Thus, for example, word count can be accessible to the device reading the buffer prior to reading the segment, even though the count was obtained after the segment was completely filled.

Specifically then, the present invention provides a high-speed data buffer for connecting a data source to a data receiver, the data buffer having a first interface receiving data from the data source and a second interface outputting the data to the data receiver. A dual port random access memory has a first port, with first address and first data lines, communicating with the first interface, and a second port, with second address and second data lines, communicating with the second interface. First address counter circuitry communicates with the first address lines to accept a first starting address and increment the first starting address applied to the first address lines as data is received from the first interface. Second address counter circuitry communicates with the second address lines to accept a second starting address and increment the second starting address applied to the second address lines as data is transmitted to the second interface.

Thus, it is one object of the invention to provide a data buffer combining the benefits of random access of buffer memory, obtained by independent control of the address lines, with the benefits of FIFO-type access of buffer memory where the address lines are controlled sequentially by first and second address counter circuitry. Sequential access through the first and second address counter circuitry eliminates the time delay inevitable in computing addresses in normal random access transfers.

A portion of the dual port random access memory may be partitioned as a circular buffer having memory addresses connected in segments, with each segment of memory addresses associated with a control block, including a valid flag. The data buffer may further include a microprocessor executing a stored program to, upon receipt of the new data from the first interface, review control blocks to find a next control block with an enabled valid flag and to load the address of the segment associated with the next control block into the first address counter. The microprocessor, upon loading the segment associated with the next control block with data from the first interface, then disables the valid flag in the next control block.

Thus, it is another object of the invention to make use of the random access memory to provide for simple management of the VFIFO structure. Because the control blocks may be randomly accessed, and yet are associated by the microprocessor with the segments, a simple flag structure can be used for buffer space management.

The microprocessor may further execute the stored program to write to the next control block a value indicating the amount of data transferred into the segment associated with the next control block.

Thus, it is another object of the invention to allow word count information to be accessed by the data receiver prior to outputting of the data of a FIFO segment, even though the word count information is not known until after the segment is fully loaded. The random access nature of the control block allows information in the control block to be moved "out-of-order" with respect to the FIFO structure of the segments.

The microprocessor may further execute the stored program to write to the next control block a value indicating the time of loading of the new data into the segment associated with the next control block.

Thus, it is another object of the invention to make use of the unique structure of the data buffer to allow simple monitoring of data latency in the buffer. Unlike true FIFO systems, performance tags need not be interleaved with actual data upsetting the sequential nature of the data and thus its rapid inputting or outputting.

The foregoing and other objects and advantages of the invention will appear from the following description. In this description, reference is made to the accompanying drawings which form a part hereof and in which there is shown by way of illustration a preferred embodiment of the invention. Such embodiment does not necessarily represent the full scope of the invention, however, and reference must be made therefore to the claims for interpreting the scope of the invention.

DETAILED DESCRIPTION OF THE INVENTION

Figure 1:
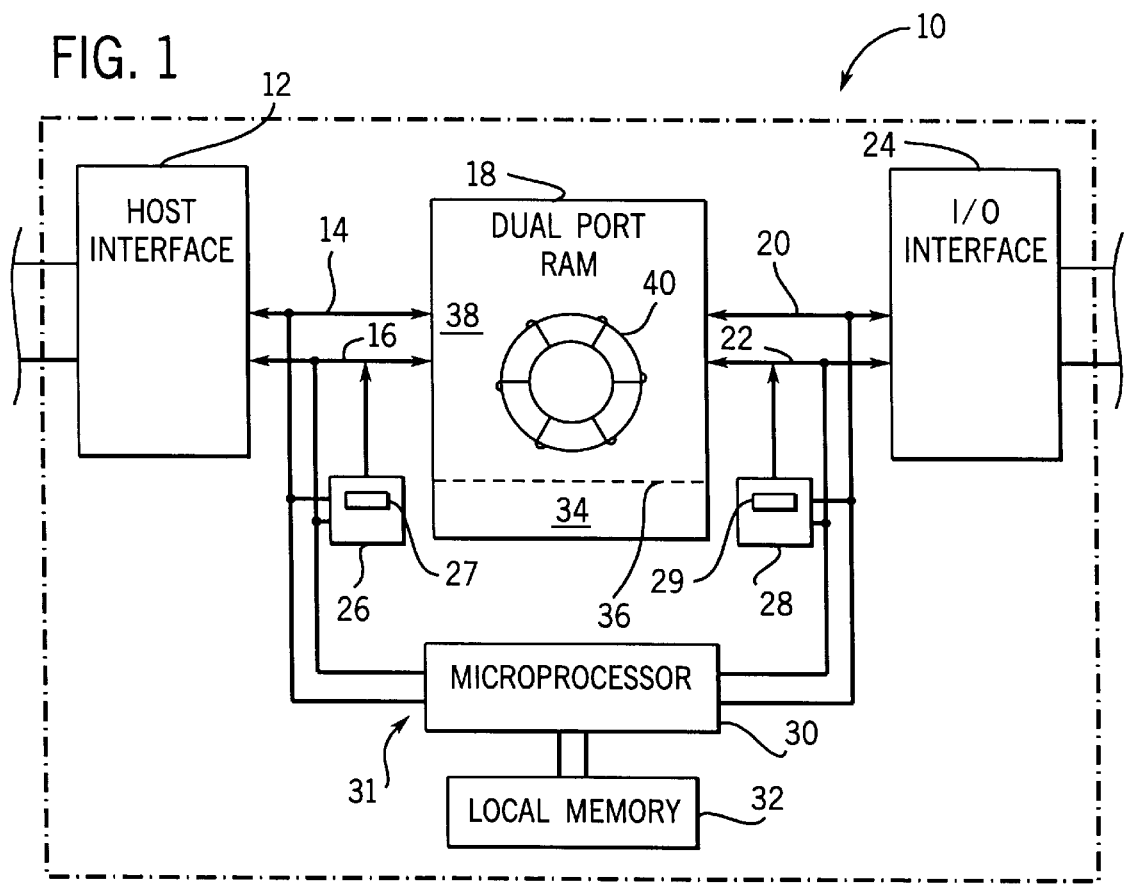
FIG. 1 is a schematic block diagram of the buffer of the present invention showing a dual port random access memory (DPSRAM) connected to a host and data source interface, and having specialized address counter circuitry controlled by a microprocessor.

Referring now to FIG. 1, a data buffer 10 of the present invention includes a host interface 12 and an I/O interface 24 between which data is buffered. During buffering, either the host interface 12 or the I/O interface 24 may provide a source of data and the other interface may receive that data.

The host interface 12 communicates with a host device (not shown) such as a high-speed computer, to receive data and addresses from that computer and to provide data and addresses to that computer as part of the data transfer. The host interface 12 is generally a direct memory access (DMA) engine allowing, as its name would suggest, direct communication with the host processor's memory. Such interfaces are well-known in the art and may include interfaces for PCI, PMC, 64-bit Sbus, Turbochannel, and Futurebus+, commercially available standards well-known in the art.

The host interface 12 communicates via data lines 14 and address lines 16 with a Dual Port Static Random Access Memory (DPSRAM) 18 so as to read and write data over data lines 14 at memory locations determined by the address on address lines 16. DPSRAMs 18 are well-known in the art.

The DPSRAM 18 includes a second set of data lines 20 and address lines 22 allowing independent reading and writing of addresses in the DPSRAM 18 without arbitration delays. This second set of data lines 20 and address lines 22 are connected to the I/O interface 24, as previously described, providing data to and receiving data from an I/O device (not shown) such as a network or disk storage unit. The I/O interface may work with any one of a number of commercial standards such as the one GHz Fibre Channel, the Fast-40 Ultra SCSI, IPI-2, Fast Wide Differential SCSI, and HiPPI standards well-known in the art.

Generally, these standards result in data transmission and reception rates that instantaneously differ between interfaces 12 and 24 so as to require buffering of data in the DPSRAM 18.

Referring still to FIG. 1, the address lines 16 and data lines 14, and the address lines 22 and data lines 20 form internal buses also communicating with address counter 26 and 28 (respectively) and with an address management circuit 31 implemented in the preferred embodiment as a microprocessor 30. The microprocessor 30 operates a stored program contained in local memory 32 which may comprise a combination of volatile and non-volatile memory types well-known in the art. It will be understood from the following description that the function of the address management circuit 31 may alternatively be implemented by other well known electronic devices including programmable gate arrays and the like or even discrete circuitry forming a state machine to execute the steps of the microprocessor's program as will be described.

Generally, when the data buffer 10 is in a VFIFO mode, address counters 26 and 28 may receive a pointer address 27 and 29 from the microprocessor 30 and upon command from microprocessor 30, automatically increment that starting address and apply it to a corresponding address line 16 or 22 as data is transmitted into or out of the DPSRAM on data lines 14 and 20. That is, address counter 26 upon command from microprocessor 30 may control address lines 16 and address counter 28 upon command from microprocessor 30 may control address lines 22.

Alternatively, in a random access mode, as will also be described, the host interface 12 and I/O interface 24 may control the address lines 16 and 22 directly.

Referring still to FIG. 1, the address space of the DPSRAM 18 is divided implicitly by the operation of the microprocessor 30 into a random access portion 34 beneath a threshold address 36 that is reserved for conventional random access, and a FIFO portion 38 above the threshold address 36 that is reserved for FIFO type transfers. Thus, for example, the host interface 12 or I/O interface 24 may read from or write to random access portion 34, reading or writing data on data lines 14 at the address specified by address lines 16. Alternatively, the host interface 12 or I/O interface 24 may sequentially transfer data into or out of the FIFO portion 38.

Figure 2:
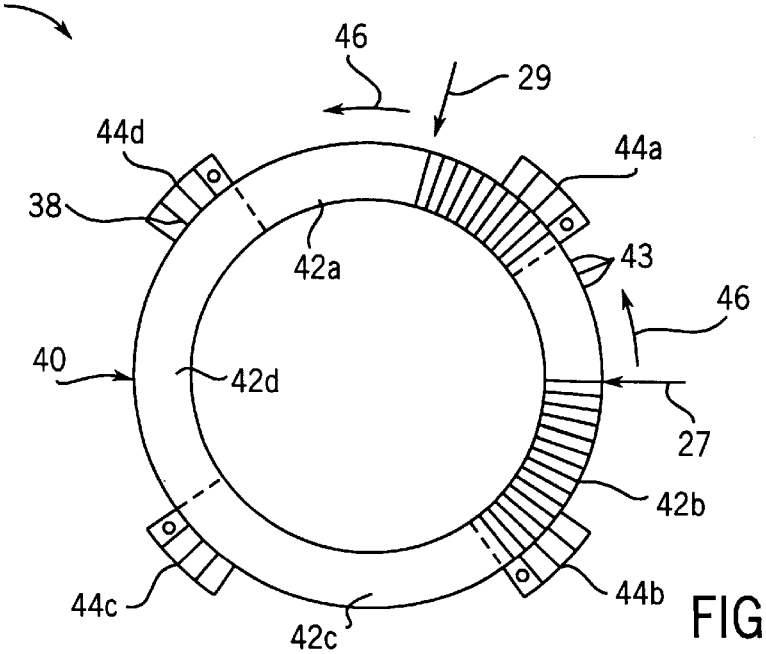
FIG. 2 is a schematic representation of the circular buffer structure realized by the present invention in the DPSRAM of FIG. 1.

Referring now to FIGS. 1 and 2, in the preferred embodiment, the FIFO buffer is arranged as thirty-one, two-kilobyte (KB) segments 42 of which only four are shown in FIG. 2 for clarity. Generally, each segment 42 will comprise an uninterrupted set of sequential addresses 43 in the DPSRAM 18.

Implicitly associated with each segment 42 by the operation of the microprocessor 30 is a four word control block 44. In FIG. 2, the association between segments 42 and control blocks 44 is indicated by the letter suffixes with control block 44a associated with segment 42a. In a preferred embodiment with thirty-one segments 42, the DPSRAM 18 of the FIFO portion 38 may be partitioned as follows:

TABLE I

| Offset Address Range | Size | Function |
| --- | --- | --- |
| 0–2FFFF | 192KB | Standard DPSRAM |
| 30000–3F7FF | 62KB | VFIFO Segments |
| 3F800–3FBFF | 1KB | Unused |
| 3FC00–3FDF0 | 496B | VFIFO control blocks |
| 3FD75–3FFFF | 528B | Unused |

Thus, threshold address 36 is 2FFFF (hexadecimal) and the thirty-one, two kilobyte buffers begin at address 30000. Note that the control blocks 44 need not have addresses physically adjacent to their segments 44.

The information of Table I is held in local memory 32 to be accessed by the microprocessor 30 in identifying or matching control blocks to segments.

Each control block holds four 32-bit words assigned as follows:

TABLE II

| Word Number | Bit Assignment |
| --- | --- |
| 0 | bit 0 = entry flag |
| 1 | bit 0–9 = word count |
|   | bit 10 = word count valid flag |
|   | bit 16–31 = command bits |
| 2 | bit 0–31 host address |
| 3 | Unused |

Referring now to FIG. 2, generally during operation of the data buffer 10 in VFIFO mode, data may be inserted in a segment 42a at an insertion point determined by pointer address 27. After each insertion of data, pointer address 27 is automatically incremented by address counter 26 to move in a generally counterclockwise direction 46 as indicated by an arrow. Simultaneously and independently, data may be read out of the I/O interface 24 from another segment 42b previously written to at the location of pointer address 29 which moves also in a counterclockwise direction 46, being automatically incremented after each read by the address counter 28.

Figure 3:
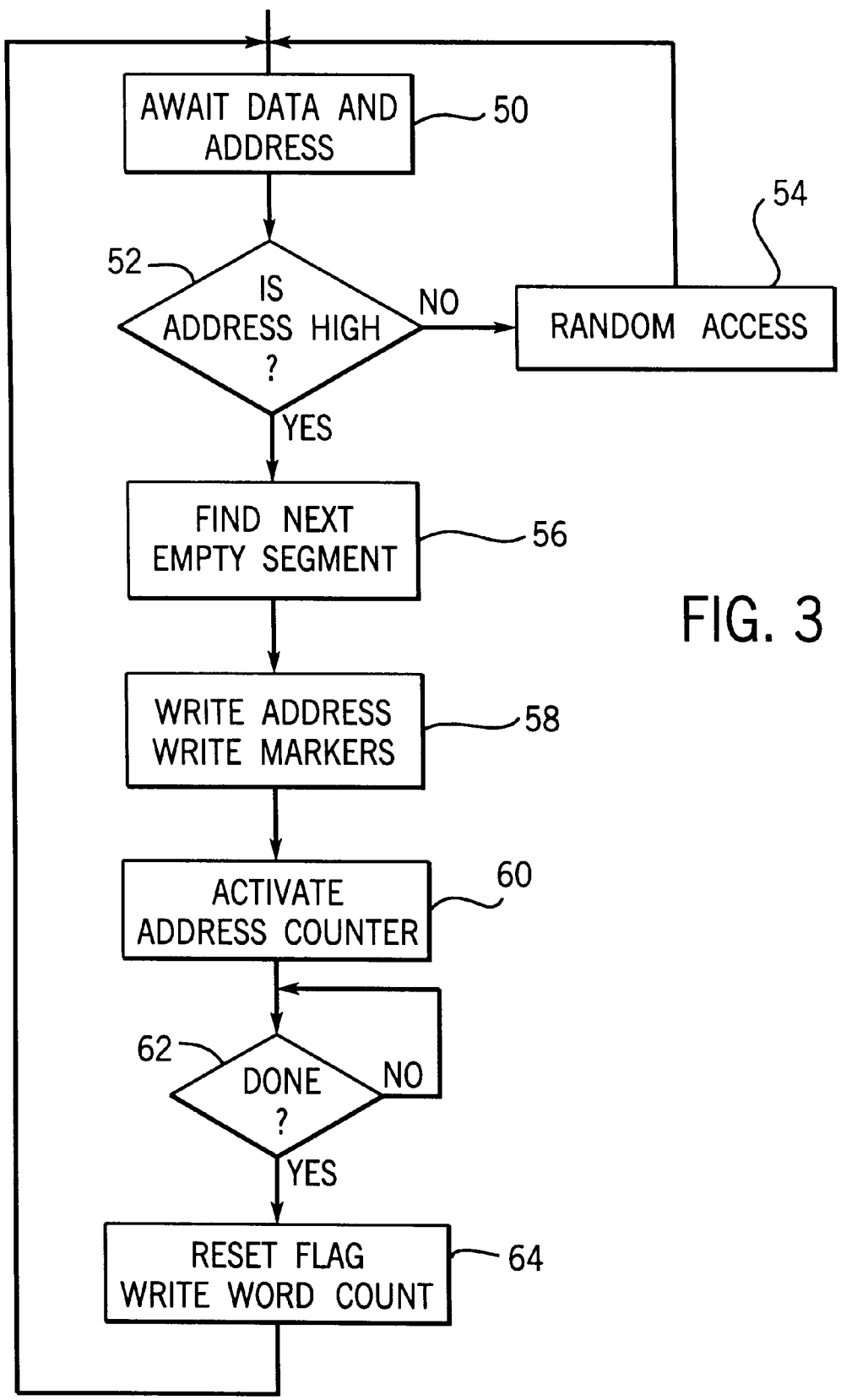
FIG. 3 is a flowchart showing the steps executed by the microprocessor in managing the receipt of data from the host interface into the circular buffer structure of FIG. 2.

Referring now to FIGS. 1 and 3, the microprocessor 30 executing a program in local memory 32, moderates the receipt of data by the DPSRAM 18 upon receipt of data and address, for example, from the I/O interface 23 as indicated by process block 50. At decision block 52 the microprocessor 30 monitoring the address lines 22 checks to see if the address is high, i.e., above threshold address 36 shown in the DPSRAM 18. If not, then the microprocessor 30 permits random access of the DPSRAM 18 as indicated by process block 54 in which an address from the address on address lines 22 is used to address the DPSRAM 18 somewhere within random access portion 34.

On the other hand, if the address on address lines 22 is higher than threshold address 36, the microprocessor 30 assumes the data on lines 20 is to be transferred in the VFIFO mode and proceeds to process block 56 to find the next empty segment 42. As shown in FIG. 2, empty segments 42 are found by examining the current location of the pointer address 28 (associated with the transmitting I/O interface 24) and reviewing the control blocks 44 of the next counterclockwise segments 42 in sequence to find a control block 44d in this case, having an empty segment as indicated by a zero stored in the validity flag of the control block as has been previously described.

Referring again to FIG. 3, next at process block 58, the address on address line 16 is written to the third word of the control block 44d so as to be passed along with the data ultimately to the host interface 12. It will be assumed, in the VFIFO mode that all the data to be transferred has addresses sequentially related from this starting address so stored.

Also at this time, a performance marker to track the performance of the data buffer 10 may be written to the second word of the control block 44d. Such a marker, for example, may be a time value, that will be recovered when the data is read, to indicate how long the data remained in the data buffer 10. Alternatively, this marker may simply be a sequential number generated by the microprocessor 30 that may be used to establish the number of segments 42 between data being currently output and data being currently input.

At the conclusion of process block 50, the microprocessor 30 stores the first address of the segment 42d in the address counter 28 as pointer address 29 and activates the circuitry of address counter 28 to increment the address automatically as each new data element is received over data lines 14 and enrolled in segment 42d. The addresses from the address counter 28 are placed on address lines 22 in lieu of any address from the I/O interface 24. The process of activating the address counter 29 is shown by process block 60 and the actual enrollment shown by decision block 62 in FIG. 3 which monitors the enrollment to determine when it is complete.

In the preferred embodiment, the segments 42 are sized so as to be at least as large as the largest permissible data block transfer and thus to eliminate the possibility of overflow prior to completion of the data transfer.

When the data transfer is complete, the program executed by the microprocessor 30 moves to process block 64 and the flag at the first word of the control block 44d is set equal to 1, showing that a valid entry exists in segment 44d. Also, a word count, being the total number of data items stored in segment 42d, is enrolled as the second word of the control block 44d as has been described.

Figure 4:
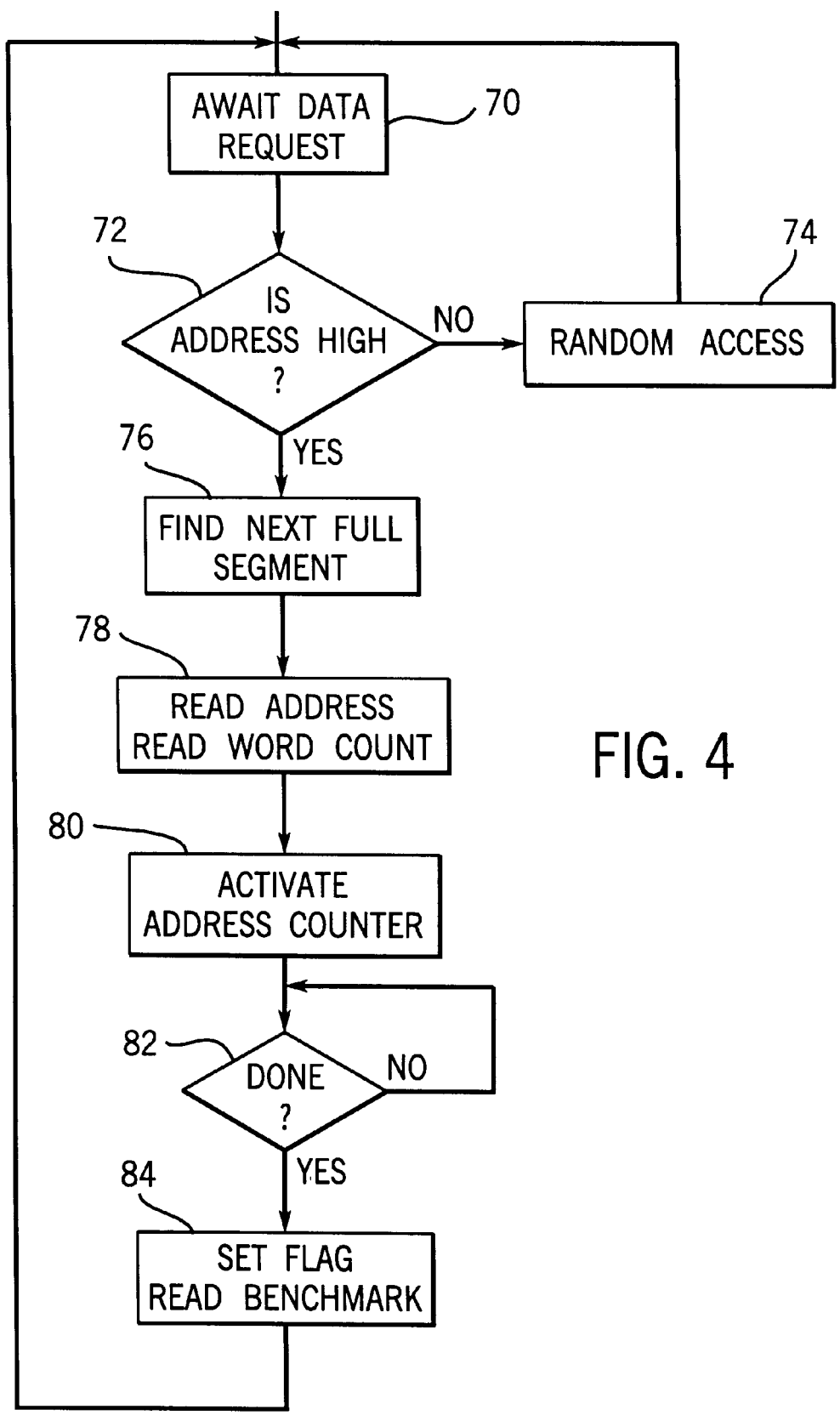
FIG. 4 is a flowchart similar to that of FIG. 3 showing the steps executed by the microprocessor of FIG. 1 in outputting data from the circular buffer of FIG. 2 to the data source interface.

Referring now to FIG. 4, the microprocessor 30 may also monitor, for example, the host interface 24 for a request for data indicated by process block 70. As before, the address on address lines 16 associated with this request is evaluated at decision block 72 to determine whether a random access request is required of the random access portion 34 of the DPSRAM 18 or not. If the address indicates a reading of random access portion 34, the microprocessor 30 proceeds to process block 74 and a random access read is allowed.

Otherwise, the microprocessor 30 proceeds to process block 76 and the microprocessor 30 finds the next full segment counterclockwise from the current pointer address 29 of address counter 28 by reviewing the first words of control blocks 44. In example FIG. 2, the microprocessor will find segment 42a and its control block 44a, having a first word indicating a valid entry. At succeeding process block 78, the address associated with the data in segment 42a from the third word of the control block 44a and the word count from the second word of the control block 44a may be read (as was placed there earlier) so that the host interface 12 may allocate sufficient receiving memory in its associated processor.

The first address of segment 42a is then loaded into address counter 26 as pointer address 27 as indicated by process block 80 and the extraction of data from segment 42a is begun with address counter 28 automatically incrementing after each word of data is transferred over data lines 20 without the need for an address to be generated and passed through host interface 12.

When this transfer process is done as indicated by decision block 82, then at process block 84, the microprocessor 30 resets the flag of the first word of control block 44a and may read the marker of the second word of the control block 44a to evaluate the performance of the data buffer 10. Note that the marker is set early in the loading of the data buffer 10 and read as a last thing in the unloading of the data buffer 10 so as to provide the most conservative measure of buffer performance.

It will be understood that the data may flow in either direction from the host interface 12 into the DPSRAM 18 to the I/O interface 24, or from the I/O interface 24 to the DPSRAM 18 and then to the host interface 12 using the above-described technique.

This description has been that of a preferred embodiment of the present invention. It will occur to those that practice the art that many modifications may be made without departing from the spirit and scope of the invention. In order to apprise the public of the various embodiments that may fall within the scope of the invention, the following claims are made.

We claim:

1. A high speed data buffer for connecting a data source to a data receiver, the data buffer comprising:

a first interface receiving data from the data source;

a second interface outputting the data to the data receiver;

a dual port random access memory having a first port with first address and first data lines communicating with the first interface, and having a second port with second address and second data lines communicating with the second interface;

first address counter circuitry communicating with the first address lines to accept a first starting address and to increment the first starting address applied to the first address lines as data is received from the first interface; and second address counter circuitry communicating with the second address lines to accept a second starting address and to increment the second starting address applied to the second address lines as data is transmitted to the second interface;

whereby the data source and data receiver may transfer data either by random access of the dual port random access memory with independent control of the address lines or by sequential access of the dual port random access memory with the first and second address counter circuitry controlling the address lines;

in which a portion of the dual port random access memory is partitioned as a circular buffer having memory addresses connected in segments with each segment of memory addresses associated with a control block including a valid flag; and including in addition address management circuitry operating:

(i) upon receipt of new data from the first interface to review control blocks to find a next control block with a enabled valid flag (ii) load the address of the segment associated with the next control block into the first address counter;

(iii) upon loading the segment associated with the next control block with data from the first interface, disabling the valid flag in the next control block.

2. The high speed data buffer of claim 1 wherein the address management circuitry is a microprocessor executing a stored program.

3. The high speed data buffer of claim 1 wherein the address management circuitry is state machine implemented with logic gates.

4. The high speed data buffer of claim 1 wherein the address management circuit further operates:

(iv) subsequent to loading the segment with data, to write to the next control block a value indicating the amount of data transferred into the segment associated with the next control block.

5. The high speed data buffer of claim 1 wherein the address management circuit further operates:

(iv) to write to the next control block an address from the first interface associated with the new data.

6. The high speed data buffer of claim 1 wherein the address management circuit further operates:

(iv) to write to the next control block a value indicating the time of loading of the new data into the segment associated with the next control block.

7. A high speed data buffer for connecting a data source to a data receiver, the data buffer comprising:

a first interface receiving data from the data source;

a second interface outputting the data to the data receiver;

a dual port random access memory having a first port with first address and first data lines communicating with the first interface, and having a second port with second address and second data lines communicating with the second interface;

first address counter circuitry communicating with the first address lines to accept a first starting address and to increment the first starting address applied to the first address lines as data is received from the first interface; and second address counter circuitry communicating with the second address lines to accept a second starting address and to increment the second starting address applied to the second address lines as data is transmitted to the second interface;

whereby the data source and data receiver may transfer data either by random access of the dual port random access memory with independent control of the address lines or by sequential access of the dual port random access memory with the first and second address counter circuitry controlling the address lines;

in which a portion of the dual port random access memory is partitioned as a circular buffer having memory address connected in segments with each segment of memory addresses associated with a control block including a valid flag also in the dual port random access memory and including in addition an address management circuit operating:

(i) upon request of new data from the second interface to review control blocks for a next control block with a disabled valid flag;

(ii) load the address of the segment associated with the next control block into the second address counter;

(iii) upon reading the data of the segment associated with the next control block to the second interface, enabling the valid flag in the next control block.

8. The high speed data buffer of claim 7 wherein the address management circuit further operates:

(iv) prior to reading data from the segment, to read the next control block for a value indicating the amount of data transferred into the segment associated with the next control block and transferring the value to the second interface.

9. The high speed data buffer of claim 7 wherein the address management circuit further operates:

(iv) to read from control block an address associated with the new data.

10. The high speed data buffer of claim 7 wherein the address management circuit further operates:

(iv) to read from the next control block a value indicating the time of loading of the new data into the segment associated with the next control block.

* * * * *